（12) United States Patent
Parker (10) Patent No.: US 6,400,258 B1
(45) Date of Patent: Jun. 4, 2002

(54) ELECTRIC ARC MONITORING SYSTEMS

(75) Inventor: Michael T. Parker, Camarillo, CA (US)

(73) Assignee: Hendry Mechanical Works, Goleta, CA (US)

(*) Notice: Subject to any disclaimer, the term of this patent is extended or adjusted under 35 U.S.C. 154(b) by 0 days.

(21) Appl. No.: 09/487,033

(22) Filed: Jan. 19, 2000

(51) Int. Cl.[7] .......................... H04B 1/00; G01R 31/08
(52) U.S. Cl. ................ 340/310.01; 340/659; 702/58; 361/111; 324/536
(58) Field of Search .................. 340/310.01, 659, 340/657; 361/111; 702/58; 324/536

(56) References Cited

U.S. PATENT DOCUMENTS

| | | | |
|---|---|---|---|
| 5,373,241 A | 12/1994 | Ham, Jr. et al. | 324/536 |
| 5,452,223 A | 9/1995 | Zuercher et al. | 702/58 |
| 5,477,150 A | 12/1995 | Ham, Jr. et al. | 324/536 |
| 5,561,605 A | 10/1996 | Zuercher et al. | 702/64 |
| 5,729,145 A * | 3/1998 | Blades | 340/650 |
| 5,748,093 A * | 5/1998 | Swanson et al. | 340/659 |
| 5,839,092 A * | 11/1998 | Erger et al. | 702/58 |

FOREIGN PATENT DOCUMENTS

| WO | WO 99/09422 | 2/1999 |
|---|---|---|
| WO | WO 99/09424 | 2/1999 |

* cited by examiner

Primary Examiner—Donnie L. Crosland
(74) Attorney, Agent, or Firm—Koppel & Jacobs (57) ABSTRACT

Systems of monitoring electric arcs substantially eliminate alternating current fundamentals and harmonics from monitored arc signatures. Such systems phase shift, delay or otherwise store a representation of the alternating current fundamental and harmonics, and substantially purge such alternating current fundamental and harmonics from the arc signatures with the stored representation of such alternating current fundamental and harmonics, while substantially preserving chaotic arc signature components. Electric arcs are then monitored from such purged arc signatures. Imperfections in such purging are detected and corrected for a provision of detectable arc signature components free of fundamentals and harmonics that could cause malfunction and false alarms.

49 Claims, 8 Drawing Sheets

FIG. 8

ELECTRIC ARC MONITORING SYSTEMS

FIELD OF THE INVENTION

The subject invention relates methods and apparatus for monitoring electric arcs.

BACKGROUND

Power supply systems and other apparatus often introduce alternating current fundamentals into the chaotic spectra of arc signatures. In practice, this frequently impedes a reliable monitoring of electric arcs, and tends either to cause false alarms or to engender a certain insensitivity to the monitoring function.

The traditional response to that problem was to filter out such alternating current fundamentals in the region of the power supply or line frequency. That kind of approach, however, precluded the monitoring system from taking into account those increasingly important components of the chaotic arc signature that are in the frequency range of an alternating current fundamental. At the same time, harmonics of the filtered-out fundamentals could still cause false alarms. Countering such problem by filtering out harmonics in addition to the fundamentals, eliminated even more otherwise detectable components from the arc signature, rendering the arc monitoring process still more insensitive.

The problem was aggravated by the fact that the chaotic spectra of arc signatures are neither synchronous with, nor correlated to, line frequency fundamentals. This in effect precludes use of approaches that generally work well in alternating current distribution systems wherein load currents typically are synchronous with and correlated to the alternating current power frequency. Moreover, the arcing information in power distribution systems is on the electric current waveform which may not have any resemblance in shape to the voltage waveform at various times and load conditions. Accordingly, relying on a voltage waveform in deriving information about the line frequency fundamental or harmonics can cause further difficulties. Problems mount further if the load goes to zero so that there is no load current to rely on.

During two flights, first from west to east and then from east to west, the attorney of record herein made EMF (electromagnetic field) measurements aboard an MD-11 passenger aircraft and obtained the following results in milligauss:

| Passenger seat, Row 26: | Fore and aft direction: | 3: crosswise 1.5 (athwartships); |
|---|---|---|
| Business Class seats | Fore and aft direction:12 | crosswise 8.5 |
| Business Class Lavatory | Fore and aft direction:12 | crosswise 8 |
| Rear Lavatories: | | |
| Starboard side, floor level: | Fore and aft direction:12 | crosswise 12 |
| Starboard side, sink level | Fore and aft direction:12 | crosswise 12 |
| Starboard side, ceiling level | Fore and aft direction:15 | crosswise 15 |
| Port side, floor level: | Fore and aft direction:9.5 | crosswise 2.5 |
| Port side, sink level | Fore and aft direction:12 | crosswise 3.5 |
| Port side, ceiling level | Fore and aft direction:15 | crosswise 10 |

It is to be noted in this respect that the MD-11 model has a third jet engine in the rear, and has a galley between the two rear lavatories.

Since there was no evidence of any arcing at the time, it may be assumed that what the gauss meter measured were fundamentals and harmonics of the aircraft's 400 Hz power supply or other regularly occurring oscillations. Since the galley on that aircraft has heavy electric cooking appliances on its starboard side, it appears that the comparatively heavy EMF crosswise readouts in the starboard side rear lavatory may represent fluctuating values, as the crew prepared food for the passengers when the starboard side measurements were taken.

Such and similar fundamentals, harmonics and fluctuating signals of a non-chaotic nature regularly occurring aboard aircraft or on ships, land vehicles or installations and the like, should be taken into account or eliminated when monitoring arcs or sparks there, and their effect should be countered in devising arc or spark monitoring equipment.

SUMMARY OF THE INVENTION

It is a general object of the invention to overcome the drawbacks and to meet the needs set forth above or otherwise expressed or implicit in this disclosure.

It is a germane object of the invention to provide improved electric arc monitoring systems.

It is a related object of the invention to provide electric arc monitoring systems which avoid false alarms from alternating current fundamentals and harmonics.

Other objects of the invention will become apparent in the further course of this disclosure.

From a first aspect thereof, the invention resides in a method of monitoring electric arcs having arc signatures including an alternating current fundamental and harmonics in addition to chaotic components characteristic of such arcs, comprising, in combination, phase shifting, delaying or otherwise storing a representation of the alternating current fundamental and harmonics, substantially purging such alternating current fundamental and harmonics from the arc signatures with the stored representation of such alternating current fundamental and harmonics, while substantially preserving the chaotic arc signatures components, and monitoring the electric arcs from the purged arc signatures.

From a related aspect thereof, the invention resides in apparatus for monitoring electric arcs having arc signatures including an alternating current fundamental and harmonics in addition to chaotic components characteristic of such arcs, comprising, in combination:, an electric arc pickup, an alternating current fundamental and harmonics phase shifter, delay or other storage having an input connected to the electric arc pickup and having an output, a summing network having a first input connected to the electric arc pickup and an oppositely poled second input connected to the output of the alternating current fundamental and harmonics phase shifter, delay or other storage and having a summing network output, and an electric arc monitor connected to that summing network output.

Within the scope of the invention, the alternating current fundamental and harmonics phase shifter, delay or other storage may include means for phase shifting, delaying or otherwise storing a representation of the alternating current fundamental and harmonics, and the summing network may include means for substantially purging said alternating current fundamental and harmonics from the arc signatures with such phase shifted, delayed or otherwise stored representation of the alternating current fundamental and harmonics, while substantially preserving the chaotic arc signature components, and the electric arc monitor may include means for monitoring the electric arcs from the purged arc signatures.

However, there is no reason in the subject disclosure and in any of the claims, other than in the first dependent means plus function apparatus claim, to consider any of the claims other than that first dependent means plus function apparatus claim to be limited in any manner pursuant to the sixth paragraph of 35 USC 112.

Also, the expression "storage" when used as a noun in this disclosure and in apparatus claims hereof is used in the broad sense of any device or apparatus in which information can be stored, such as confirmed in "The New IEEE Standard Dictionary of Electrical and Electronics Terms," of the Institute of Electrical and Electronics Engineers (1993), and in the "Microsoft Press Computer Dictionary" by Microsoft Corporation (1997).

BRIEF DESCRIPTION OF THE DRAWINGS

The subject invention and its various aspects and objects will become more readily apparent from the following detailed description of preferred embodiments thereof, illustrated by way of example in the accompanying drawings which also constitute a written description of the invention, wherein like reference numerals designate like or equivalent parts, and in which.

MODES OF CARRYING OUT THE INVENTION

Figure 1:
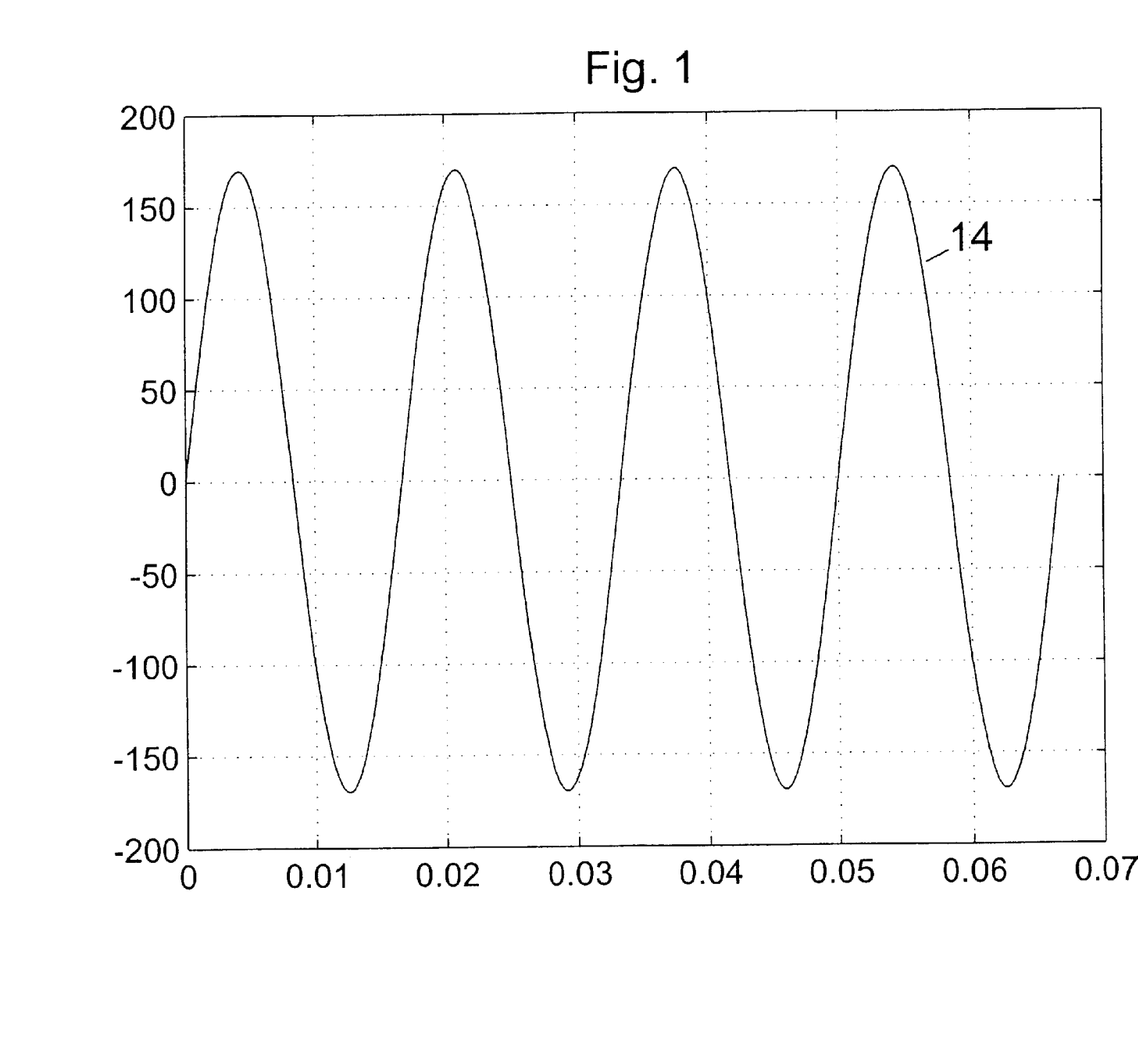
FIG. 1 is a view of a voltage waveform of an alternating current fundamental.
Figure 2:
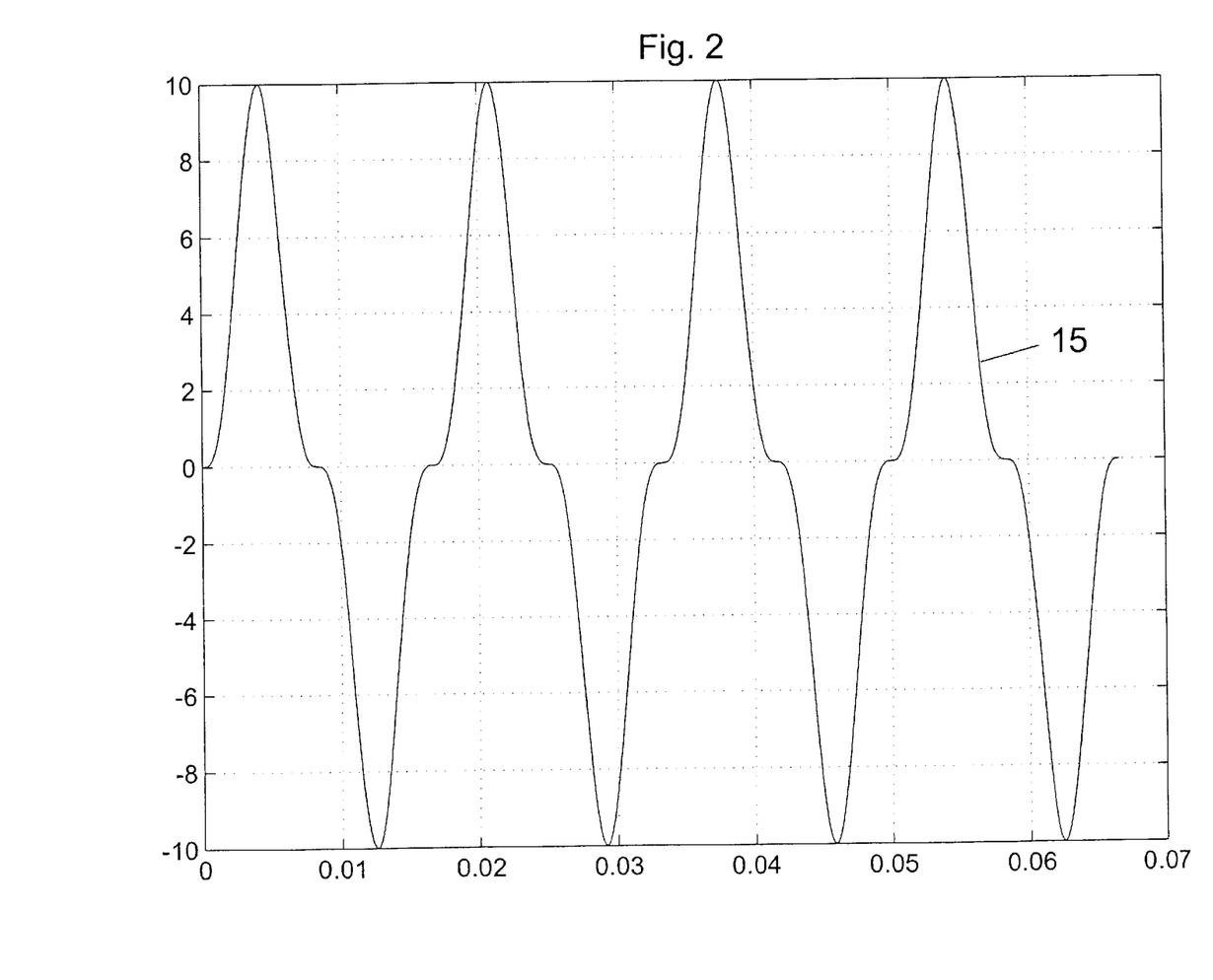
FIG. 2 is a current waveform showing the fundamental with harmonics.

The drawings show methods and apparatus 10 and 100 for monitoring electric arcs 12 having arc signatures 13 including an alternating current fundamental 14 and harmonics 15 in addition to chaotic components 16 characteristic of the arcs, such as illustrated with the aid of FIGS. 1 to 6. By way of background, FIG. 1 shows an alternating voltage fundamental 14 as a sine wave. FIG. 2 shows a current waveform of the fundamental 14 with harmonics 15 imposed thereon.

Figure 3:
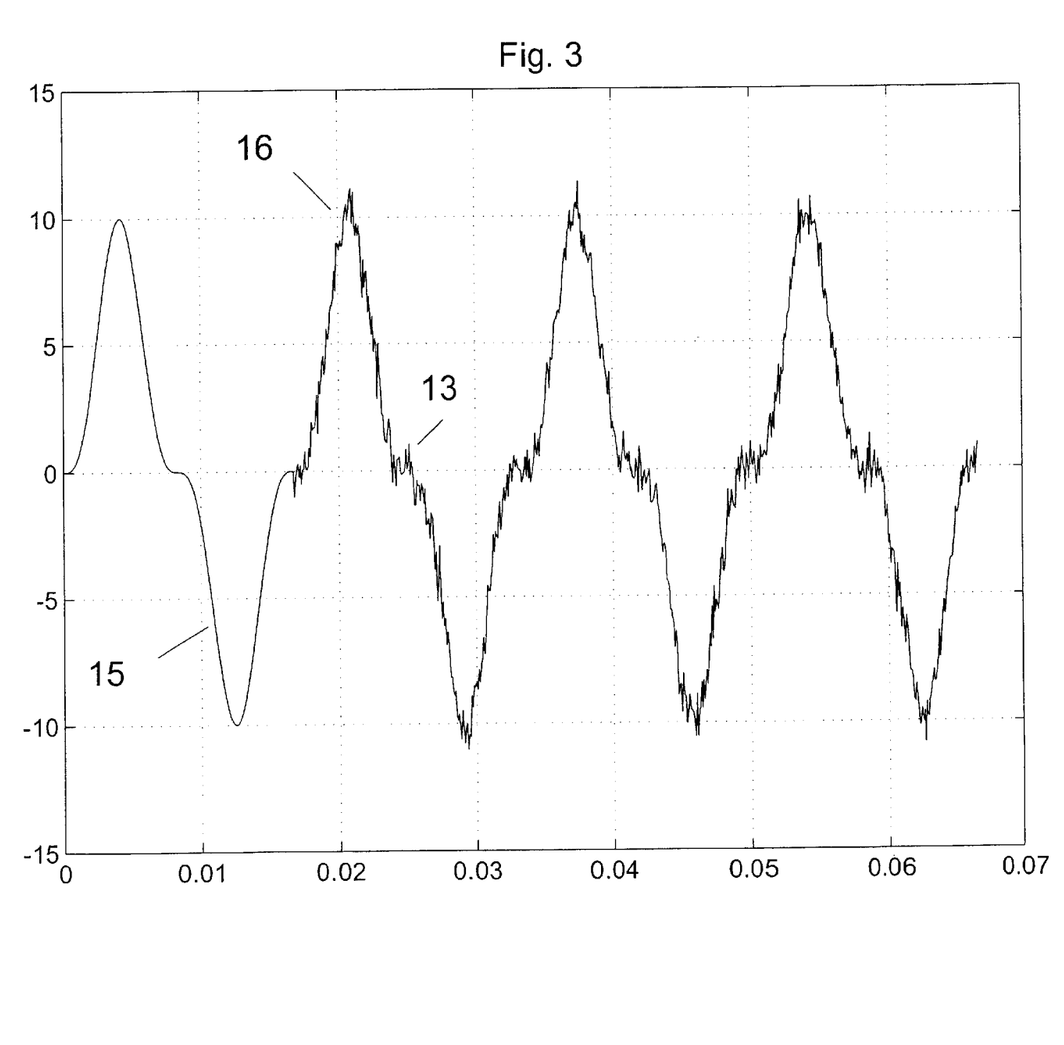
FIG. 3 is a view similar to FIG. 2, but showing the fundamental with harmonics upon inception of an electric arc after one cycle, superimposing an electric arc signature on the fundamental with harmonics.

Against this background, FIG. 3 shows a signature 13 of an arc 12 which had its inception after one period or cycle of the fundamental 14. Such arc signature includes the alternating current fundamental with harmonics 15 with the chaotic components 16 characteristics of the arc superimposed thereon. In practice, such arc signature may be picked up by several known devices.

Figure 6:
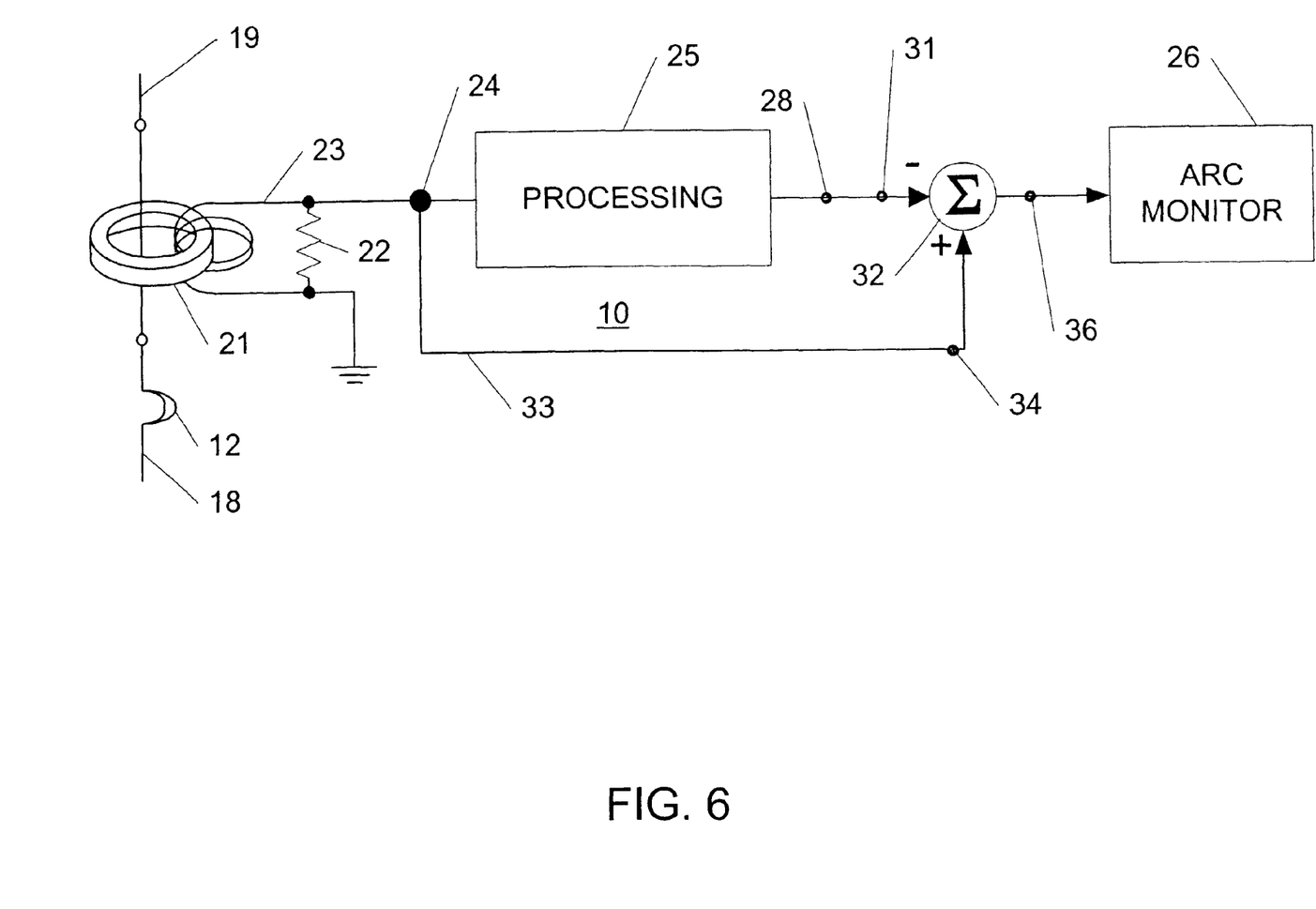

In this respect, FIG. 6 shows lines 18 and 19 as representative of an alternating current power supply or load circuit in a large variety of installations and equipment, and a transformer-like pickup 21 having a termination resistor 22. The picked-up arc signatures 13 travels along a line 23 to an input terminal 24 of a circuit 25.

In addition to the typical chaotic components 16, recurring or continuous alternating current fundamentals 14 occur frequently in arc signatures, and sources thereof include the line frequency of alternating current supplies which energize the circuit 18, 19 and thereby the arcs 12. Within the scope of the invention, use of the term "alternating current fundamental" also extends to signals that have a substantially regular frequency and are of a relatively narrow-band nature, as compared to the broad-band chaotic nature of arc signatures, even if such signals are accompanied by harmonics of their alternating current fundamental.

While the regularity of oscillations has been and is considered a strength throughout most of the field of electrical science and technology, and generally stands in favorable contrast to the chaos of arc signatures and the like, the subject invention in effect turns such strength into a weakness and exploits such weakness by tricking such interfering alternating current fundamentals and harmonics out of arc signatures, so to speak, without essentially affecting the detectable arc signature components in such purging operation.

The subject invention thereby distinguishes itself from the kind of prior-art filtering which, as mentioned above, would cut out valuable arc signature components as well and thereby impede, if not frustrate, a reliable arc monitoring process. The invention also distinguishes itself from any familiar approach that would eliminate an undesirable signal by matching it in phase to an inverted version thereof. Applying such technique, which has proven itself in other fields, to an elimination of alternating current fundamentals and harmonics in arc signatures would in effect also eliminate the chaotic components from arc signatures, thereby leaving nothing to detect or monitor.

The invention stores a representation of the alternating current fundamental 14 and harmonics 15 and substantially purges such alternating current fundamental and harmonics from arc signatures 13 with that stored representation of the alternating current fundamental and harmonics, while substantially preserving the chaotic components. Electric arcs 12 are then monitored from the purged arc signatures.

In broad apparatus terms, an aspect of the invention combines an electric arc pickup, such as shown but not limited to the device at 21, an alternating current fundamental and harmonics phase shifter, delay or other storage, such as shown but not limited to the equipment or devices at 25 or 41, having an input, such as at 24, connected to the electric arc pickup and having an output, such as at 28, a summing network, such as at 32, having an input, such as at 34, connected to the electric arc pickup and an oppositely poled input, such as at 31, connected to the output, such as at 28, of the alternating current fundamental and harmonics phase shifter, delay or other storage, such as at 25 and/or 41, and having a summing network output, such as at 36, and an electric arc monitor, such as 26, connected to that summing network output. While the drawings show and their description mentions means for phase shifting, delaying or otherwise storing a representation of the alternating current fundamental and harmonics, such as at 25 and 41, and means for substantially purging such alternating current fundamental and harmonics from the arc signatures with such phase shifted, delayed or otherwise stored representation of the alternating current fundamental and harmonics, while substantially preserving the chaotic arc signature components, and also mentions means for monitoring the electric arcs from the purged arc signatures, such as at 26, there is no reason in the subject disclosure to limit the scope of the invention to such means, inasmuch as the expression "storage" when used as a noun in this disclosure and in apparatus claims hereof is used in the broad sense of any device or apparatus in which information can be stored, such as confirmed in "The New IEEE Standard Dictionary of Electrical and Electronics Terms," of the Institute of Electrical and Electronics Engineers (1993), and in the "Microsoft Press Computer Dictionary" by Microsoft Corporation (1997) and inasmuch as other key terms herein set forth are similarly broad in their accepted meaning.

Moreover, there are various ways within the scope of the invention in which a representation of the alternating current fundamental 14 and harmonics 15 can be stored. Accordingly, FIG. 6 employs the word "PROCESSING" for the component or block 25. By way of example, and not by way of limitation, the block 25 according to an embodiment of the invention may include a microprocessor apparatus for storing a representation of the alternating current fundamental 14 and harmonics 15. Such microprocessor apparatus may have an input at terminal 24 and an output at an opposite terminal 28. Microprocessor apparatus capable of storing signal components are well known, and it is also well known that such microprocessor apparatus may be used to manipulate signals being stored and processed, as is regularly done in various fields of technology for optimum effects. Storing by microprocessor, with or without special effects, may be classified under "digital storage" as applicable to the practice of the subject invention.

Processing within the scope of the invention includes the imposition of a delay on the alternating current fundamental 14 and harmonics 15, or subjecting such fundamental and harmonics 15 to a delay, since delaying a signal amounts to storing it during the delay. Even phase shifting and similar technologies effect a certain storage function. Even passing all or part of the arc signature through a microprocessor eventuates a delay of such signal. Such delaying function may be of a digital or analog nature.

Figure 4:
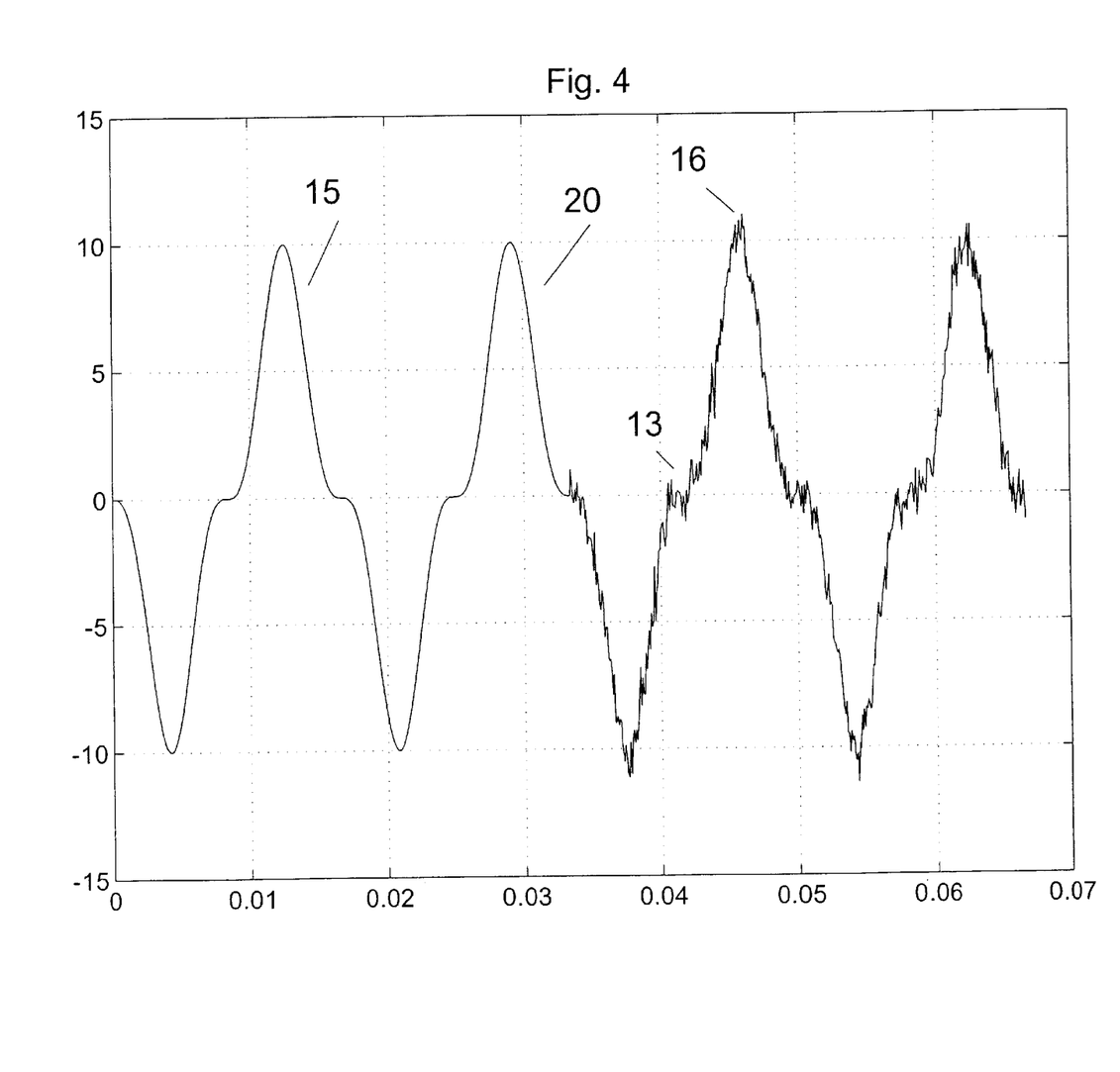
FIG. 4 is a view similar to FIG. 3, but showing a delay by one cycle and an inversion of the fundamental with harmonics with superimposed electric arc signature.

In this or any other manner within the scope of the invention, an embodiment thereof generates an out of phase version of the alternating current fundamental 14 and harmonics 15, such as seen by way of example in FIG. 4 at 20. In terms of FIG. 6, that either may be done in the processing block 25, whereby the generated out of phase version appears at the output terminal 28 of the circuit 25, or may in effect be accomplished by employing a summing network 32 with a negative input 31. The alternating current fundamental and harmonics 15 are then substantially purged from the arc signatures 13 with such out of phase version, while the chaotic components 16 of the arc signatures are substantially preserved for a monitoring of electric arcs 12 from such purged arc signatures, such as at 26.

Within the scope of the invention, phase shifting circuitry, also called a phase shifter, may be employed in the processing block of FIG. 6. To be effective, such circuitry needs to be able to phase shift not only the alternating current fundamental 14, but also harmonics 15 thereof, and to effect a phase shift of preferably at least half a cycle of that fundamental and optimally also of chaotic arc components.

By way of example, a so-called "all pass" filter could be used at 25 to provide the desired out of phase version. As is well known, that kind of filter has inherent phase shifting properties and its gain is constant over a wide frequency range. The maximum phase shift is limited by the order of the filter, which places practical limitations on the use of such filters as the order of harmonics to be eliminated increases.

In this respect and in general, according to a preferred embodiment of the invention, the above mentioned stored or out of phase version 20 illustrated in FIG. 4 and symbolized by components 25, 28, 31 and 32 in FIG. 6, is out of phase by an integer of one-half cycle of the alternating current fundamental 14, which includes an integer of a cycle or period of such alternating current fundamental, such as illustrated in FIG. 4 showing by way of example a delay or phase shift or other storage by one period or cycle.

Such storage is currently easier to effect with a microprocessor or with another delay device, than with a phase shifter that needs to be capable of shifting harmonics along with the fundamental frequency, if not ideally chaotic arc signature components as well.

However, in either case, the subject invention works because the steady state line related components are the same from cycle to cycle, so that the signal from the next cycle or half cycle will cancel out the signal from the previous cycle or half cycle. Accordingly the subject invention is capable of effectively eliminating alternating current fundamental 14 and harmonics 15 from arc signatures 13. This alone would, however, not be operative, if the detectable chaotic arc signature components 16 were eliminated as well in the end result. However, the subject invention is based on the recognition that, unlike steady state components 14 and 15, the electromagnetic manifestations of electric arcs vary chaotically from cycle to cycle and even from half cycle to half cycle and integers thereof. Therefore, such chaotically changing components 16 of arc signatures 13 are not eliminated by subtracting amplitude variations occurring during any given cycle or half cycle from the by then varied amplitude variations of the preceding or succeeding cycle or half cycle of the alternating current fundamental 14, so to speak.

Figure 5:
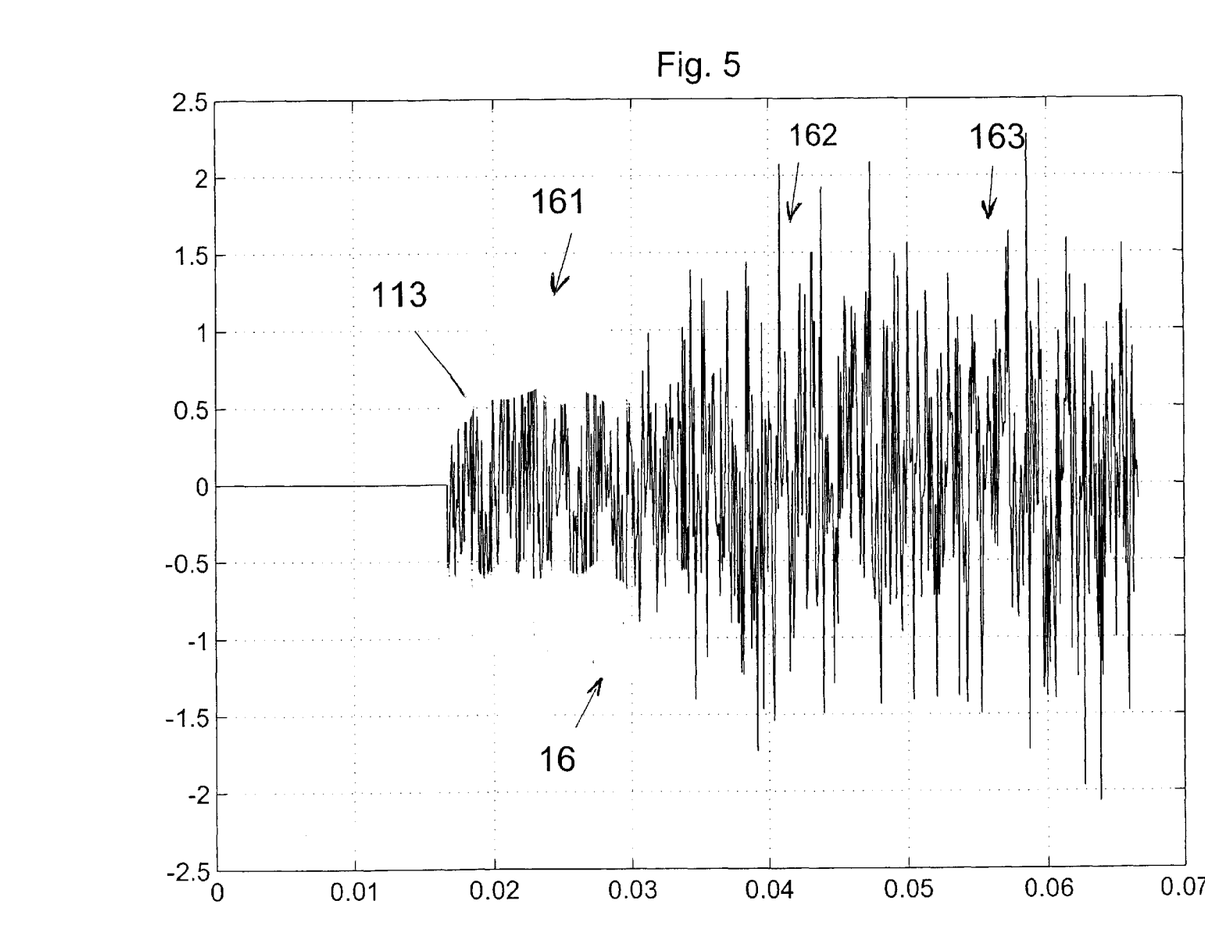
FIG. 5 is an amplified view of a result of a superimposition of the waveforms of FIG. 6 is a schematic with block diagram of an arc signature processing and monitoring apparatus according to an embodiment of the invention.

The phase shifting, delaying or other storing techniques used in purging arc signatures pursuant to the subject invention thus effectively preserve the detectable chaotic components 16 while effectively eliminating regular fundamental and harmonic signals 14 and 15 from interfering with the monitoring process, such as seen in FIG. 5.

In the embodiment of FIG. 6, the generated stored, delayed or out of phase version is applied from the output 28 of the processing stage 25 to a negative input terminal 31 of a summing network 32 which receives the original arc signature 13 with alternating current fundamental 14 and harmonics 15 from the pickup 21 via line 23, terminal 24, a line 33 and an opposite or positive input terminal 34 of that summing network 32. The alternating current fundamental 14 and harmonics 15 thus are substantially purged from the arc signature. Such essentially purged or purified arc signature appears via output of the summing network 32 at a terminal 36 for the arc detection or other monitoring function symbolized by block 26 in FIG. 6.

While the embodiment illustrated in FIG. 6 shows the input of the processing circuit 25 as receiving the picked up arc signature 13 from the line 23, as does the line 33, it should be understood that within the scope of the invention the alternating current fundamental 14 and harmonics 15 could be derived from the same source that provides such fundamental and harmonics in the arc signature 13. For instance, if a power supply is responsible for such fundamental and harmonics, then the processing component 25 could have its input connected to such power supply. That, however, would only be a less preferred embodiment of the invention. For one thing, since the component of the arc signature that signifies "arc" varies chaotically from half cycle to half cycle of the fundamental 14, a preferred embodiment of the invention derives the out of phase version of the alternating current fundamental 14 and harmonics 15 from the arc signature 13 which includes such alternating current fundamental and harmonics, such as seen in FIGS. 3 and 4.

This in effect creates the possibility that the detectable chaotic arc signature component may be enhanced, such as shown by way of example in FIG. 5 where the arc signature component 16 of a stored cycle is superimposed, such as by the summing network 32, on the chaotically different arc signature component of the next cycle. FIG. 5 is interesting in this respect if one considers the superimposition of FIGS. 3 and 4 as producing the purged arc signature 113 of FIG. 5. In particular, the purged arc signature 113 of FIG. 5 may be considered as comprising a first third 161, a second third 162 and a third third 163. The detectable chaotic arc signature components 16 are stronger in the second and third third 162 and 163 than in the first third 161. In this respect, it may be noted that the first third 161 stems from the superimposition of (a) the cycle shown in FIG. 3 in which the arc 12 has its inception, with (b) the inversion of the preceding cycle that has been delayed, phase shifted or otherwise stored by one cycle before the inception of that arc and that, therefore, does not yet have the chaotic arc signature components on it. On the other hand, the succeeding second and third cycle after inception of that arc do have chaotic arc signature components on them, such as seen in FIGS. 3 and 4. Since such arc signature components vary chaotically from cycle to cycle or faster, there is a high probability that superimposition of chaotic arc signature components from any cycle, half cycle or integer thereof and of inversed chaotic arc signature components from any previous cycle, half cycle or integer thereof in fact enhances the detectable or monitorable chaotic arc signature, such as seen at 162 and 163 in FIG. 5, as compared to 161.

That kind of advantage is also lost if the processing unit 25 receives the picked-up arc signature 13, such as via line 23 and terminal 24, but uses a kind of storage, phase shifting or delaying technique that does not preserve at least some of the chaotic arc signature components 16 in the processed signal at the negative summing network input 31.

As may be deduced from the first third 161 of the purified arc signature 113 depicted in FIG. 5, detectable chaotic arc signature components still result, such as at 36, even if either one of the two alternating current signals applied to the summing network inputs 31 and 34 lacks the picked-up arc signature components 16. However, a preferred embodiment preserves in the processing at 25 as much of the chaotic arc signature component 16 as possible, as distinguished from less preferred embodiments of the invention.

In addition, or quite apart from this, connecting the input of the processing component 25 to the power supply for the purpose of deriving the alternating current fundamental 14 and harmonics 15 for processing might place undue reliance on the voltage waveform, whereas arcing information as mentioned above typically is on the electric current waveform.

Accordingly an embodiment of the invention relies on the current waveform of the monitored load, such as by using a current transformer as shown at 21, since arcing currents have no impact on the voltage waveform of a perfect voltage source and most sources of power are voltage sources. However, since practical voltage sources have some finite impedance, arcing currents flowing through such source impedance cause correlated voltage drops reflecting in some proportion the size and shape of arcing currents. In the extreme, the source impedance becomes infinite, and the source of power is a current source instead of a voltage source. In that case, there is no information contained in the current waveform and the chaotic nature of the arc is found on the voltage waveform instead. This is in accordance with the basic principle of duality in electronics engineering.

In this respect, an advanced embodiment of the invention monitors voltage and current, such as in a combination known as impedance (voltage over current) or in another combination. By way of example and not by way of limitation, reference may in this respect be had to the embodiment of the invention shown in FIG. 7.

Figure 7:
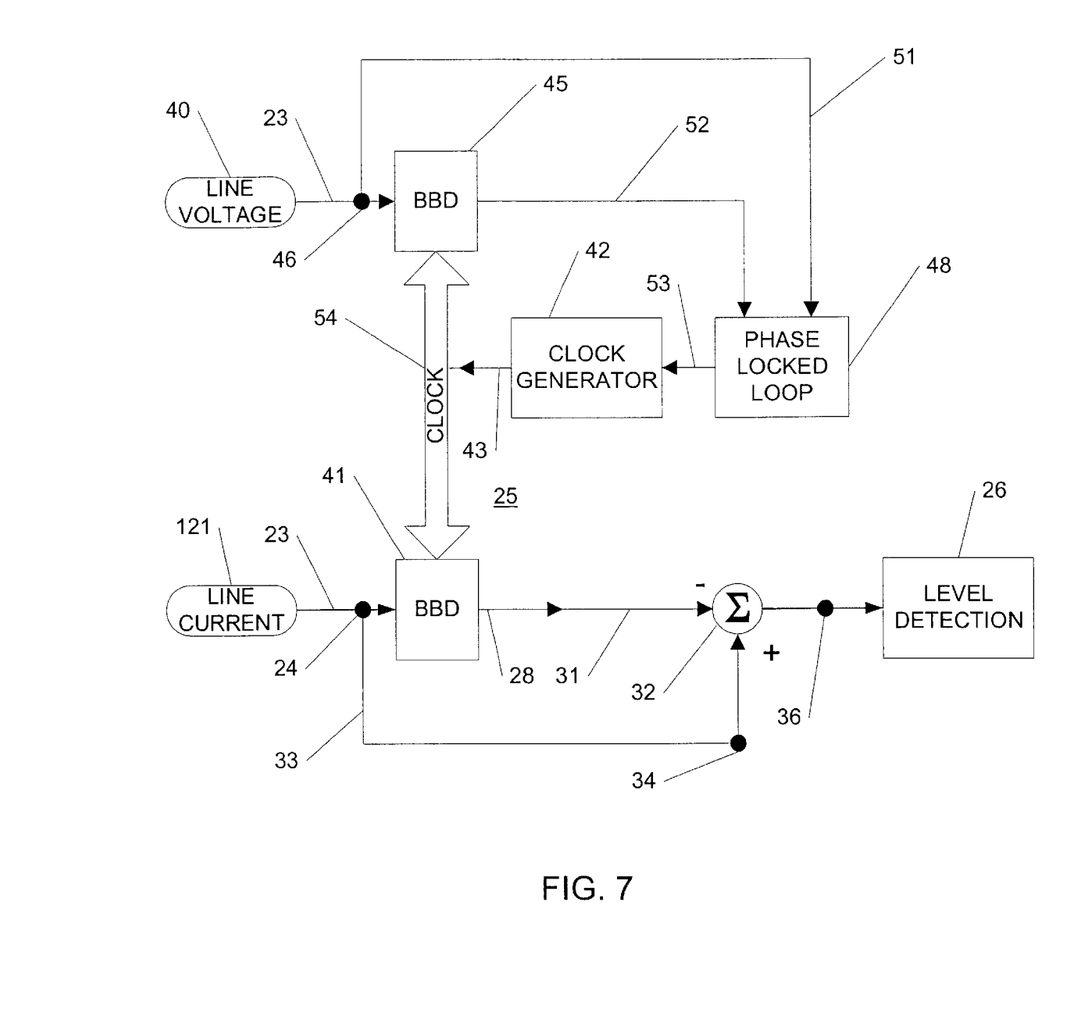
FIG. 7 is a schematic of a modification of FIG. 6 according to a further embodiment of the invention.

In particular, as indicated by a block 40 in FIG. 7, the electric arc monitoring system 100 shown in FIG. 7 samples line voltage or otherwise relies on the voltage waveform, in addition to the line current waveform indicated by a block 121 which includes the arc signature 16. By way of example, an embodiment of the invention monitors the voltage from the power line 19 and its return, such as by an alternating current voltage pickup at 40. On the other hand, the block 121 in FIG. 7 may employ the current transformer 21 such as shown in FIG. 6.

In this respect, the processing component 25 of FIG. 6 may include the components 41, 42 and 43 of FIG. 7. By way of example, the component 25 in FIG. 6 or 41 in FIG. 7 may include a delay device or delay, or may otherwise impose a delay for providing the above mentioned stored or out of phase version. Such delay preferably is substantially inversely proportional to a frequency of the fundamental 14. By way of example, such delay may be substantially equal to one divided by a frequency of such fundamental, which makes the delay equal to twenty milliseconds for a European-type of line frequency of fifty Hertz as the fundamental 14, or equal to sixteen and two third milliseconds for the typical American sixty Hertz line frequency, or 2.5 milliseconds for the four hundred Hertz power supply frequency aboard aircraft and so forth.

A currently attractive solution for imposing the desired delay is the use of bucket brigade devices, or BBD, which, as is well known, comprise a sequence of switching transistors interconnecting capacitive storage nodes, with gates of switching transistors being driven in sequence by clock pulses, whereby the bucket brigade device is clocked. This qualifies as an example of a digital delay, as does the above mentioned microprocessor version, but the practice of the invention is not limited to either.

The bucket brigade device or other clocked device in the processing component 25 may be clocked in terms of the fundamental 14.

Within the scope of the invention, the storage duration, phase shift or delay in component 25 can be fixed as long as the frequency of the alternating current fundamental 14 is stable or as long as the requirements of a given application are not very high. For instance, one could manually tune a bucket brigade device clock to the power line frequency or other fundamental 14. However, variations in the frequency of such fundamental or drift in the phase shift or timing components could render such an approach unacceptable.

It may be realized at this point that alternating current power loads draw current differently from direct current loads. Alternating current loads are much more constrained to draw current at the power line frequency and its harmonics. This may be seen from the example of a load having to draw energy at a 70 Hz rate from a 60 Hz power supply. The 70 Hz load requirement would engender periodic instances where the load needs power while the power of the 60 Hz supply goes through its zero crossing. The 70 Hz rate load thus could not properly function. In the field of electrical engineering, such problems frequently are handled through frequency transformation, such as via rectification of the 60 Hz power or with frequency converters. Similar and further problems are engendered by different line harmonics.

An aspect of the subject invention avoids such kind of problems and enables reliable arc monitoring in alternating current circuitry by effectively removing fundamentals and harmonics.

In this respect and in general, an embodiment of the invention detects imperfections in the purging process and corrects the same, such as in the phase shifting, generation of an out of phase version, delay or other storing. By way of example and not by way of limitation, two examples of this broader concept are illustrated in FIGS. 7 and 8.

Figure 8:
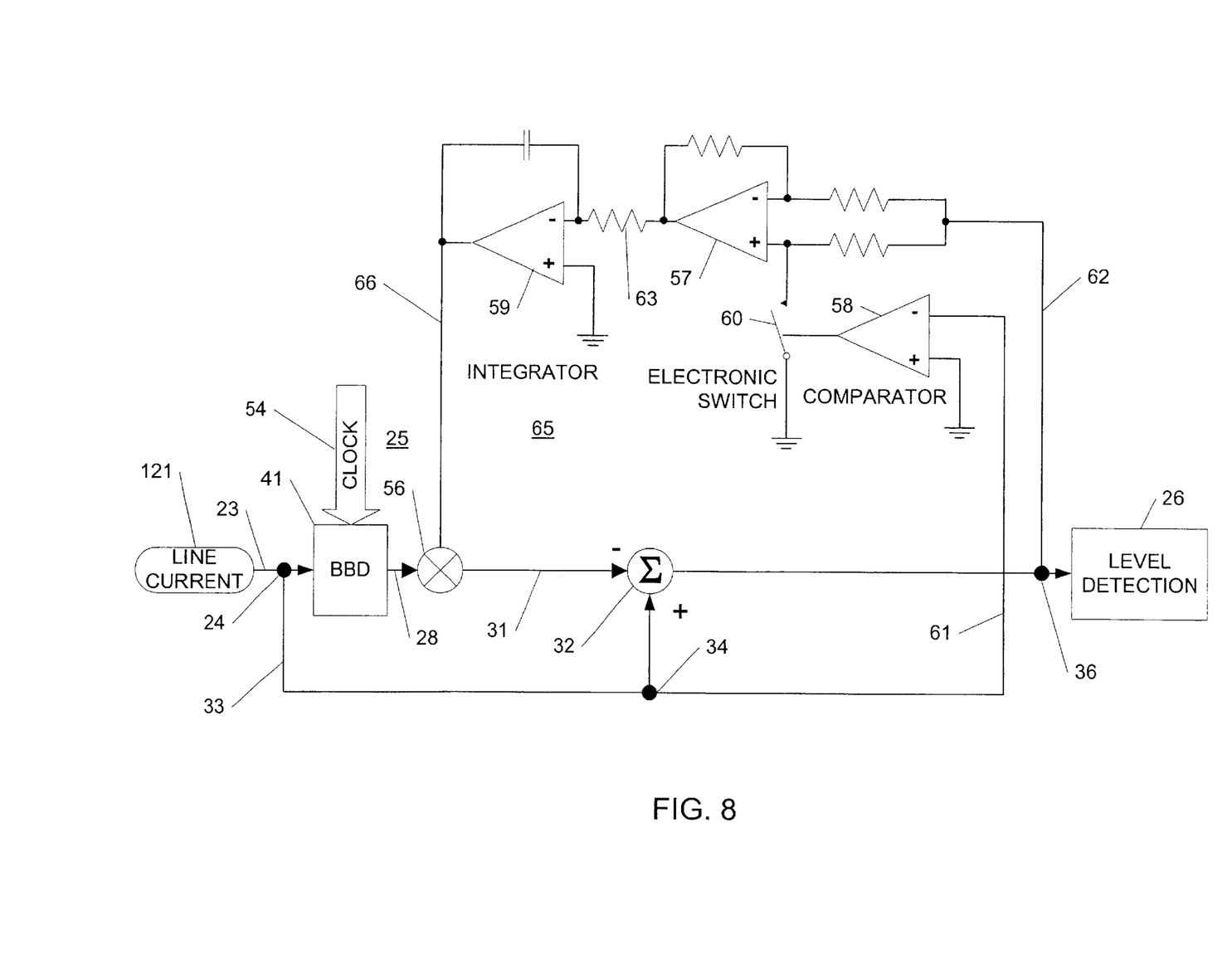
FIG. 8 is a schematic of an expansion of the apparatus of FIG. 6 or of FIG. 7 pursuant to a further embodiment of the invention.

In particular, FIG. 8 supplies an example of detecting imperfections in the purging process from the substantially purged arc signature, such as at the output 36 of summing network 32, and of correcting them, such as in the phase shifting, generation of an out of phase version, delay or other storing in or at 25 or 41, for instance.

FIG. 7 furnishes an example of detecting imperfections in the purging process from the stored representation of the alternating current fundamental. In a way, this may also be said with respect to the embodiment represented in FIG. 8, where signals at 36 are influenced by the representation of the alternating current fundamental stored or otherwise processed at 25 or 41, for instance. Moreover, the embodiments illustrated in FIGS. 7 and 8 may be combined into one overall embodiment of the invention wherein imperfections in the purging process are detected and are corrected for optimum arc monitoring.

In this respect and in general, imperfections in the purging process may be detected from a voltage of the alternating current fundamental, such as indicated by way of example at 40 in FIG. 7 and from a stored representation of the alternating current fundamental, such as produced at 45, for example.

According to another embodiment of the invention, the storage duration, phase shift or other generation of an out of phase version, or the delay is servoed to the alternating current fundamental, and preferably to the alternating current voltage fundamental, such as seen at 14 in FIG. 1. For instance, one could servo to the null of the fundamental so as to adjust to varying line conditions.

In this respect, FIG. 7 shows an expanded version of the processing circuitry 25 pursuant to a further embodiment of the invention. Such expanded processing circuitry 25 includes bucket brigade devices, BBD, 41 and 45. An exemplary bucket brigade device that may be used in or as the processing component 25 in FIG. 6 or in or as each component 41 and 45 is the MN3007 1024-Stage Low Noise BBD by Panasonic, such as shown and described in their 1999 Catalog on Audio Signal Delay BBD Series, MN3000 Series, MN3200 Series, on pages 34 to 37, using a clock generator in the processing component 25 or at 42, which, by way of example, may comprise the Panasonic clock generator driver MN3101 shown and described on pages 58 to 61 of that Catalog.

As indicated above with respect to FIG. 6 such clock may be fixed for a fixed delay in the component 25. However, according to an embodiment of the invention, the storing, phase shifting or generation of an out of phase version, or the delay, such as at 25 or 41, is clocked in correspondence to the alternating current fundamental, or includes a clock 54 clocked in correspondence to the alternating current fundamental.

According to the embodiment illustrated in FIG. 7, such delay or clock is servoed to a voltage of the alternating current fundamental, such as the voltage waveform shown in FIG. 1 and symbolized by the block 40 in FIG. 7 where such line voltage waveform is applied via a terminal 46 to the bucket brigade device, BBD, 45 of what may be called a voltage servo loop 47 that includes a phase-locked-loop, PLL, 48.

In apparatus terms, the phase shifter, out of phase version generator, delay or other storage, such as at 25, includes a servo control 47 having an input connected to a source of the alternating current fundamental. As shown in FIG. 7 with reference to the waveform 14 in FIG. 1, an alternating current fundamental voltage pickup 40 may be used, and a servo control 47 in the phase shifter, out of phase version generator, delay or other storage may have an input 46 connected to such alternating current fundamental voltage pickup.

Such servo control may include the phase-locked-loop or PLL 48 having a first input 51 receiving the undelayed voltage waveform 14 via terminal 46, and a second input 52 receiving the output of the servo BBD 45 in the voltage loop 47. That servo BBD 45 and its clock generator driver 42 are selected or designed and operated to delay the voltage waveform by the desired number of half cycles or half cycle integers. In response to such inputs at 51 and 52, the PLL 48 produces an output signal or voltage at 53 which drives the clock generator at 42 so as to maintain the exact delay, phase shift or other storage for the desired number of integers. Pursuant to the embodiment illustrated by way of example in FIG. 7, the PLL 48 thus causes the clock generator/BBD driver 42 to provide for both the "voltage" BBD 45 and the "current" BBD 41 a clock signal 54 that clocks both of such BBD's so to maintain the exact phase shift, delay or other storage for the elimination of the alternating current fundamental and harmonics 15 from the picked-up arc signature 13.

As long as there is no drift or undesirable shift variation, the clock signal 54 is at its designed nominal value for the given desired integer of phase shift, delay or storage at 25 or 41. However, whenever such drift or undesired shift occurs, the PLL 48 produces an error signal at 53 for the clock generator 42 to produce a corresponding variation in the clock signal 54 or rate of clocking of both BBD's 41 and 45, until the phases at 51 and 52 are again in coincidence for the exact integer shifting, delay or storage. The currently discussed embodiment of the invention thus controls the arc signature cleansing process in a servoed manner, even without provision of a feedback loop in the purging circuit 24 through 36. Rather that embodiment provides a PLL 48 or other phase-locked-loop in an auxiliary, preferably voltage-waveform-responsive servo circuit 47 and the like.

Within the scope of the invention, the remainder of the circuitry may be the same as in FIG. 6, with the BBD 41 clocked as in FIG. 7 being incorporated in the processing component 25 of FIG. 6.

However, FIG. 8 shows a further refinement according to a preferred embodiment of the invention, illustrated in the context of FIG. 7, but equally applicable to the embodiment of FIG. 6.

In particular, the expanded embodiment of FIG. 8 inserts a variable gain block 56 between the output terminal 28 of the above mentioned processing component 25 or BBD 41 and the negative input 31 of the summing network 32, thereby enabling compensation of gain variations in the arc signature cleansing process.

In this respect, if the amplitude of the signal processed at 25 or delayed at 41 is affected by such processing, phase shifting, delaying or other storing operation, then the line-correlated current signal in the picked-up arc signature would not be canceled out when the delayed and incoming non-delayed signals are subtracted from each other, such as at the summing network or component 32. In practice, such discrepancies may eventuate false alarms.

An embodiment of the invention addresses this potential problem, such as with the aid of a correlating system manifested by way of example by a correlator 65 shown in FIG. 8 as comprising what may be called a controlled inverter 57 driven by a comparator circuit 58 and driving an integrator 59.

By way of background, as long as the fundamental with harmonics 15 of the phase shifted, delayed or otherwise stored picked-up arc signature 13 cancels out the fundamental with harmonics in the undelayed incoming picked-up arc signature, the gain in the loop is kept constant and chaotic arc signature components 16 in the purged arc signature are applied via terminal 36 to the arc or level monitor 26 for detection. In terms of FIG. 8, there is then no need for the correlator 65 or its integrator 59 to supply any gain correcting signal to the variable gain block 56. However, in case of gain variations in the delay stage 41 or other processing circuitry 25, a component of the fundamental and harmonics could "bleed through" the summing network 32 and via terminal 36 cause registration of a false alarm at the arc monitoring or detection level 26, if left uncorrected.

FIG. 8 shows the correlator and its comparator, controlled inverter, and integrator as operational amplifiers in a manner familiar to those skilled in the art, and shows the comparator 58 as operating an electronic switch 60. These components may be of conventional design per se and those skilled in the art will recognize that they can be implemented in various configurations on the basis of their nature, function and cooperation herein disclosed.

In this respect, if the electronic switch 60 is closed, the non-inverting input of the controlled inverter 57 is grounded and such component, therefore, is in an inverting configuration, supplying a gain or signal of −1 to the integrator 59, such as via a resistor 63. Conversely, if that electronic switch 60 is open, such as shown in FIG. 8, then the controlled inverter 57 is non-inverting and, therefore, supplies to the integrator 59 a gain or signal of +1.

Assume now that a positive signal on the inverting input of the comparator 58 causes the output of that comparator to go low, and that a low of that comparator output causes the electronic switch 60 to open. During this time, the gain on the controlled inverter 57 is +1, and a positive signal on line 62 will cause the output of that correlator to be also positive. Similarly, if the inverting input of the comparator 58 is negative, the gain of the controlled inverter 57 will be −1, and if the signal on line 62 is also negative, the output of the controlled inverter 57 will again be positive because of the −1 gain (−1×−1=+1). Therefore, it can be seen that if the signal on line 61 that is on the inverting input of the comparator 58 is in phase with the signal on line 62, then the controlled inverter 57 will produce a positive output during both the negative and the positive half cycles of these two signals, similar in appearance to a full-wave rectified positive output. This will cause the integrator 59 to slew in a positive direction for the appropriate gain correction, such as at 56.

Conversely, if the signal on line 61 that is on the inverting input of the comparator 58 is positive while the signal on line 62 is negative, then the output of the controlled inverter 57 is negative. Likewise, if the inverting input of the comparator 58 is negative while the signal on line 62 is positive, then the output of the controlled inverter 57 is again negative. Therefore, it can be seen that if the signal applied to the inverting input of the comparator 58 is 180 degrees out-of-phase with the signal on line 62, then the output of the controlled inverter 57 is negative. As in the preceding example, the appearance will be similar to a full-wave rectified output, except that such output is now negative. This will cause the integrator 59 to slew in a negative direction for the appropriate gain correction, such as at 56.

If the signal applied to the controlled inverter 57, that is the output of the summing network 32 as applied via terminal 36 and line 62, bears no relationship to the signal on line 61, that is to the picked-up arc signature 13 with fundamental and harmonics 15 applied via terminal 34 and line 61, then the instances of the signal on line 62 being positive or negative with respect to the signal on line 61 will have no long-term bearing on correlation, and the integrator 59 and gain variator 56 will not be moved either more positively or negatively. Accordingly, as long as the output 36 of the summing network 32 essentially contains only detectable chaotic arc signature components uncorrelated to the fundamental with harmonics 15 in the picked-up arc signature 13, then there is no need to correct the gain, such as at 56 or otherwise, of the processing stage 25 or BBD stage 41.

However, the embodiment of the invention illustrated by way of example in FIG. 8 exploits the above mentioned combination of comparator and correlator functions to determine if and when too much or too little out-of-phase signal is being added, such as at the summing network 32, to the picked-up arc signature signal 13 for cancellation of the fundamental and harmonics frequency components from such picked-up arc signature signal for optimum detection and monitoring of the arc 12. The integrator 59 then effects corrective action in combination with the gain variating function or stage 56 in the delay stage 41 or other processing operation 25 until the output 36 of the summing network 32 or other result of the operation of the subject invention essentially contains only detectable chaotic arc signature components 113 unaffected by the fundamental with harmonics 15 in the arc signature 13 as picked up from a load circuit or the like.

In this or any other manner within the scope of the invention, gain variations in the in the phase shifter, out of phase version generator, delay or other storage at 25, are compensated for preservation of the chaotic components during the purging of the alternating current fundamental and harmonics 15 from the arc signatures.

The variable gain stage 56 in FIG. 8 is representative of a variable gain in the phase shifter, out of phase version generator, delay or other storage at 25, and there is a gain sensor, such as at 65, having a first input 61 or 62 connected to the electric arc pickup, and a second input 62 or 61 connected to the phase shifter, out of phase version generator, delay or other storage at 25, and an output, such as at 66, indicative of gain variations in the phase shifter, out of phase version generator, delay or other storage at 25 and connected to that variable gain or gain stage 56. It may be noted in this respect that line 61 of the inverting input of the comparator 58 could be connected to the terminal 36, and that line 62 of the controlled inverter 57 could instead be connected to the terminal 34 within the scope of that embodiment of the invention.

As apparent from that fact, the gain sensor 65 may include a comparator 58 having one of the above mentioned first and second inputs 61 and 62 of the gain sensor connected to the electric arc pickup and having a switched comparator output at 60, and a controlled inverter having the other of the first and second inputs 61 and 62 of the gain sensor. In other words, if the gain sensor 65 has two inputs 61 and 62 as defined above, then the comparator 58 may have an input that constitutes one of these gain sensor input, and the controlled inverter may have an input that constitutes the other of these two gain sensor inputs. The controlled inverter 57 is also connected to the switched comparator output at 60, such as at the non-inverting input of that controlled inverter 57 as shown by way of example FIG. 8. The controlled inverter 57 also has an inverter output, such as at 63. An integrator 59 may be connected between that inverter output and the variable gain or gain stage 56, such as disclosed above.

It may be recognized at this point that the currently disclosed aspect of the invention provides imperfections detectors, such as at 47 in FIG. 7 and/or 65 in FIG. 8, for detecting and correcting imperfections in the purging of the alternating current fundamental and harmonics from arc signatures. As shown by way of example in FIG. 8, the imperfections detector 65 has a first input 61 connected before the storage 25 or other processing 41 and a second input 62 connected after such storage or other processing. By way of example and not by way of limitation, the imperfections detector 65 may have a first input 61 connected to the electric arc pickup 21 or 121 and a second input 62 connected to the summing network 32.

Such imperfections detector has an error signal output 66, and an imperfections corrector 56 is connected between such error signal output and the storage 25 or other processing 41.

The stage 45 in FIG. 7 may be seen as a representation of the delay 41 or other storage at 25 and may be connected by way of example to the alternating current fundamental voltage pickup. The imperfections detector 47 has a first input 51 connected to the alternating current fundamental voltage pickup 40 and a second input 52 connected to such representation 45 of the delay or other storage. Such imperfections detector 47 has an error signal output 53 and an imperfections corrector is connected between such error signal output and the delay stage 41 or other storage.

In the embodiment as illustrated in FIG. 7, the imperfections corrector includes a variable clock generator 42 which supplies a variable clock signal 54 to both the delay stage 41 or other storage 25 and to the representation 45 thereof.

By way of example, imperfections detected in the embodiment as shown in FIG. 7 include variations in the voltage fundamental that would produce an imperfect purification of the picked-up arc signature of the alternating current fundamental and harmonics. By correcting such variations from half cycle to half cycle, if necessary, preferred embodiments of the invention assure provision of a detectable arc signal composed only of chaotic components of the arc signature, such as shown in FIG. 5, for instance, thereby also preventing the false alarms that were caused in the past by bled-through alternating current fundamentals and harmonics.

Various techniques may be employed in the practice of the subject invention and its embodiment. Reference may, for example, be had to U.S. Pat. Nos. 5,373,241 and 5,477,150, for Electric Arc and Radio Frequency Spectrum Detection, by Howard M. Ham, Jr. and James J. Keenan, issued, respectively, Dec. 13, 1994 and Dec. 19, 1995 to Hendry Mechanical Works, and to the International Application No. PCT/US97/14497, filed Aug. 14, 1997, and published under International Publication No. WO 99/09424, on Feb. 25 1999, and to the International Application No. PCT/US98/16521, filed Aug. 10, 1998, and published under International Publication No. WO 99/09422, on Feb. 25, 1999, with Hendry Mechanical Works as International applicant. These references are herewith incorporated by reference herein, and disclose various electric arc detectors and monitors which may be employed in the practice of the subject invention, such as as arc monitors at 26 in FIGS. 6 to 8, for instance. These references also disclose numerous instances of utility which are also applicable to the subject invention and its various embodiments.

Moreover, the subject extensive disclosure renders apparent or suggests to those skilled in the art various modifications and variations within the spirit and scope of the invention.

I claim:

1. In a method of monitoring electric arcs having arc signatures including an alternating current fundamental and harmonics in addition to chaotic components characteristic of said arcs, the improvement comprising in combination:

storing a representation of said alternating current fundamental and harmonics;

substantially purging said alternating current fundamental and harmonics from said arc signatures with said stored representation of said alternating current fundamental and harmonics, while substantially preserving said chaotic components; and monitoring said electric arcs from the substantially purged arc signatures.

2. A method as in claim 1, wherein:

said storing proceeds digitally.

3. A method as in claim 1, wherein:

chaotic components of said arc signatures are stored along with said representation of said alternating current fundamental and harmonics.

4. A method as in claim 1, wherein:

chaotic components of said arc signatures are digitally stored along with said representation of said alternating current fundamental and harmonics.

5. A method as in claim 1, wherein:

said representation is stored for substantially a duration of an integer of one-half cycle of said alternating current fundamental.

6. A method as in claim 1, wherein:

imperfections in said purging are detected and are corrected.

7. A method as in claim 1, wherein:

imperfections in said purging are detected from said substantially purged arc signature and are corrected.

8. A method as in claim 1, wherein:

imperfections in said purging are detected from said substantially purged arc signature and are corrected in said storing.

9. A method as in claim 1, wherein:

imperfections in said purging are detected and are corrected.

10. A method as in claim 1, wherein:

imperfections in said purging are detected from said substantially purged arc signatures and are corrected.

11. A method as in claim 1, wherein:

imperfections in said purging are detected from said substantially purged arc signatures and are corrected in said storing.

12. A method as in claim 1, wherein:

imperfections in said purging are detected from the stored representation of the alternating current fundamental and are corrected.

13. A method as in claim 1, wherein:

imperfections in said purging are detected from the stored representation of the alternating current fundamental and are corrected in said storing.

14. A method as in claim 1, wherein:

imperfections in said purging are detected from a voltage of the alternating current fundamental and from the stored representation of the alternating current fundamental and are corrected.

15. A method as in claim 1, wherein:

imperfections in said purging are detected from a voltage of the alternating current fundamental and from the stored representation of the alternating current fundamental and are corrected in said storing.

16. A method as in claim 1, wherein:

said storing is servoed to said alternating current fundamental.

17. A method as in claim 1, wherein:

said storing is servoed to a voltage of said alternating current fundamental.

18. A method as in claim 1, wherein:

said storing is clocked in correspondence to said alternating current fundamental.

19. A method as in claim 1, wherein:

gain variations in said storing are compensated for during said purging of said alternating current fundamental and harmonics from said arc signatures.

20. A method as in claim 1, wherein:

said representation of said alternating current fundamental and harmonics is derived from said arc signatures including an alternating current fundamental and harmonics.

21. A method as in claim 1, wherein:

said storing includes generating an out of phase version of said alternating current fundamental and harmonics; and said purging includes substantially purging said alternating current fundamental and harmonics from said arc signatures with said out of phase version, while substantially preserving said chaotic components.

22. A method as in claim 11, wherein:

said out of phase version is digitally generated.

23. A method as in claim 11, wherein:

chaotic components of said arc signatures are included in said out of phase version.

24. A method as in claim 11, wherein:

said version is out of phase substantially by an integer of one-half cycle of said alternating current fundamental.

25. A method as in claim 11, wherein:

said out of phase version of said alternating current fundamental and harmonics is derived from said arc signatures including an alternating current fundamental and harmonics.

26. A method as in claim 1, wherein:

said storing includes subjecting said alternating current fundamental and harmonics to a delay.

27. A method as in claim 20, wherein:

said delay substantially is inversely proportional to a frequency of said alternating current fundamental.

28. A method as in claim 20, wherein:

said delay is substantially equal to one divided by a frequency of said alternating current fundamental.

29. A method as in claim 1, wherein:

said delay is effected with an electronic bucket brigade device.

30. Apparatus for monitoring electric arcs having arc signatures including an alternating current fundamental and harmonics in addition to chaotic components characteristic of said arcs, comprising in combination:

an electric arc pickup;

an alternating current fundamental and harmonics storage having an input connected to said electric arc pickup and having an output;

a sunming network having a first input connected to said electric arc pickup and an oppositely poled second input connected to said output of said alternating current fundamental and harmonics storage and having a summing network output; and an electric arc monitor connected to said summing network output.

31. Apparatus as in claim 30, wherein:

said alternating current fundamental and harmonics storage includes means for storing a representation of said alternating current fundamental and harmonics; and said summing network includes means for substantially purging said alternating current fundamental and harmonics from said arc signatures with said stored representation of said alternating current fundamental and harmonics, while substantially preserving said chaotic components; and said electric arc monitor includes means for monitoring said electric arcs from the purged arc signatures.

32. Apparatus as in claim 30, wherein:

said storage is digital.

33. Apparatus as in claim 30, wherein:

said storage is adapted to store chaotic components of said arc signatures are stored along with said alternating current fundamental and harmonics.

34. Apparatus as in claim 30, wherein:

said storage has a storage cycle substantially of a duration of an integer of one-half cycle of said alternating current fundamental.

35. Apparatus as in claim 30, wherein:

said storage includes a clock clocked in correspondence to said alternating current fundamental.

36. Apparatus as in claim 30, including:

an imperfections detector having a first input connected before said storage and a second input connected after said storage, and having an error signal output; and an imperfections corrector connected between said error signal output and said storage.

37. Apparatus as in claim 30, including:

an imperfections detector having a first input connected to said electric arc pickup and a second input connected to said summing network, and having an error signal output; and an imperfections corrector connected between said error signal output and said storage.

38. Apparatus as in claim 30, including:

an alternating current fundamental voltage pickup;

a representation of said storage;

an imperfections detector having a first input connected to said alternating current fundamental voltage pickup and a second input connected to said representation of said storage, and having an error signal output; and an imperfections corrector connected between said error signal output and said storage.

39. Apparatus as in claim 30, including:

a variable gain in said storage; and a gain sensor having a first input connected to said electric arc pickup, a second input connected to said storage, and an output indicative of gain variations in said storage and connected to said variable gain.

40. Apparatus as in claim 39, wherein:

said gain sensor includes a comparator having one of said first and second inputs connected to said electric arc pickup and having a switched comparator output, a controlled inverter having the other of said first and second inputs, being connected to said switched comparator output, and having an inverter output, and an integrator between said inverter output and said variable gain.

41. Apparatus as in claim 39, wherein:

said gain sensor includes an amplitude comparator having said first input connected to said electric arc pickup, and said second input connected to said storage, and a comparator output indicative of gain variations in said storage, and an integrator connected between said comparator output and said variable gain.

42. Apparatus as in claim 30, wherein:

said storage includes a servo control having an input connected to a source of said alternating current fundamental.

43. Apparatus as in claim 30, including:

an alternating current fundamental voltage pickup; and a servo control in said storage having an input connected to said alternating current fundamental voltage pickup.

44. Apparatus as in claim 30, wherein:

said storage includes a phase shifter for said alternating current fundamental and harmonics.

45. Apparatus as in claim 30, wherein:

said storage includes a delay for said alternating current fundamental and harmonics.

46. Apparatus as in claim 30, wherein:

said storage includes a delay with a clock clocked in correspondence to said alternating current fundamental.

47. Apparatus as in claim 30, wherein:

said storage includes a delay and a servo control for said delay having an input connected to a source of said alternating current fundamental.

48. Apparatus as in claim 30, including:

an alternating current fundamental voltage pickup; and a delay with servo control in said storage having an input connected to said alternating current fundamental voltage pickup.

49. Apparatus as in claim 30, wherein:

said storage includes an electronic bucket brigade device.

* * * * *